(12) United States Patent
Danielsons

(10) Patent No.: US 6,751,266 B1
(45) Date of Patent: Jun. 15, 2004

(54) RF TRANSMITTER EMPLOYING LINEAR AND NON-LINEAR PRE-CORRECTORS

(75) Inventor: David Christopher Danielsons, Maineville, OH (US)

(73) Assignee: Harris Corporation, Melbourne, FL (US)

( * ) Notice: Subject to any disclaimer, the term of this patent is extended or adjusted under 35 U.S.C. 154(b) by 668 days.

(21) Appl. No.: 09/596,490

(22) Filed: Jun. 19, 2000

Related U.S. Application Data

(63) Continuation-in-part of application No. 09/343,340, filed on Jun. 30, 1999, now Pat. No. 6,242,978.

(51) Int. Cl.$^7$ .............................................. H04L 25/49
(52) U.S. Cl. ....................... 375/296; 375/297; 455/63.1
(58) Field of Search ................................ 375/295, 296, 375/297, 285; 330/149, 151; 332/123, 124, 159, 160, 162; 455/63.1; 348/608

(56) References Cited

U.S. PATENT DOCUMENTS

| | | | |
|---|---|---|---|
| 4,453,133 A | * 6/1984 | Travis | 330/149 |
| 4,870,371 A | * 9/1989 | Gottwald et al. | 330/149 |
| 4,879,519 A | * 11/1989 | Myer | 330/149 |
| 5,621,354 A | 4/1997 | Mitzlaff | 330/52 |
| 5,850,162 A | 12/1998 | Danielsons | 330/149 |
| 6,054,895 A | 4/2000 | Danielsons et al. | 330/149 |
| 6,335,767 B1 | * 1/2002 | Twitchell et al. | 348/608 |
| 6,519,010 B2 | * 2/2003 | Twitchell et al. | 348/608 |

FOREIGN PATENT DOCUMENTS

| | | |
|---|---|---|
| EP | 0367458 A2 | 10/1989 |
| EP | 0860940 A2 | 2/1998 |
| EP | 0899870 A1 | 8/1998 |

OTHER PUBLICATIONS

International Search Report PCT/US01/20500.

* cited by examiner

*Primary Examiner*—Chieh M. Fan
(74) *Attorney, Agent, or Firm*—Tarolli, Sundheim, Covell & Tummino L.L.P.

(57) ABSTRACT

A radio frequency (RF) transmitter system is presented having an input circuit for receiving an RF signal to be amplified and transmitted. A series circuit is provided which includes first and second cascaded amplifier networks located downstream from the input circuit and wherein the first amplifier network is located upstream from the second amplifier network and wherein the first and second networks respectively include first and second non-linear amplifiers that exhibit non-linear response characteristics to the RF signal and that introduce non-linear distortions into the RF signal and that the second network includes a filter that introduces linear distortions into the RF signal. The first correction circuit is located upstream from the series circuit for pre-correcting the RF signal in a manner to compensate for the linear and non-linear distortions introduced by the second amplifier network. A second pre-correction circuit is interposed between the first correction circuit and the first amplifier network for pre-correcting the RF signal to compensate for the non-linear distortions introduced by the first amplifier network. The second pre-correction circuit includes a third non-linear amplifier selected so as to exhibit a non-linear response characteristic to an applied RF signal similar to that of the first amplifier.

11 Claims, 2 Drawing Sheets

RF TRANSMITTER EMPLOYING LINEAR AND NON-LINEAR PRE-CORRECTORS

This is a continuation-in-part of my co-pending U.S. patent application, Ser. No. 09/343,340, filed Jun. 30, 1999 now U.S. Pat. No. 6,242,978.

TECHNICAL FIELD

The present invention is directed to the art of RF broadcast transmission systems and, more particularly, to improvements in providing pre-correction of an information signal prior to amplification and transmission.

BACKGROUND OF THE INVENTION

It is known that various communications systems require amplification of an information signal. The signal may be provided in an analog format or digital format and converted to an analog signal which is then applied to a high power amplifier.

An amplifier may be modeled as a simple gain block with constant gain. In reality, devices employed for amplifiers include bi-polar transistors, field effect transistors and the like. These devices typically do not have inherent input and output impedance that matches the desired source and load impedance. Matching circuits are employed to transform the amplifying device impedances to those of the desired source and load. These matching circuits do not have infinite bandwidth and therefore create linear distortions (sometimes referred to herein as memory-full distortions).

Amplifiers also create non-linear distortions (sometimes referred to herein as non-memory-full distortions). Fixed supply voltages ultimately limit the maximum available output power from an amplifier and determine the point of amplifier compression. Their mode of operation determines other potential distortions. For example, class A/B or class B amplifiers generate cross-over distortion.

In order to reduce amplifier memory-full and non-memory-full distortions, pre-correction circuits have been employed. Linear pre-correction circuits behave in such a way as to modify a signal input in time or frequency domain. Non-linear pre-correction circuits modify a signal in the amplitude or phase domain.

A transmitter amplifier may be modeled as a cascade of blocks consisting of linear and non-linear blocks. For a typical amplifier, these consist of a high power amplifier input network which has a filter, the amplifying device itself, and an amplifier output network which has a high power output filter. The distortion correction circuits may be arranged in inverse or reverse order in terms of pre-correction linear and non-linear distortion correcting circuits.

Reference is made to a co-pending U.S. patent application Ser. No. 09/312,354 filed on May 14, 1999 entitled BROADCAST TRANSMISSION SYSTEM WITH DISTRIBUTED CORRECTION and which was filed in the names of Edwin R. Twitchell and Robert J. Plonka and assigned to the same assignee as the present application and which co-pending application is herein incorporated by reference. FIGS. 2 and 3 herein are based on that application and each includes a power amplifier having an input filter and an output filter with the filters providing linear distortion to the information signal. The information signal is taken from a data stream that is supplied to pre-correctors located upstream from the power amplifier. The pre-correctors include a pair of linear equalizers and a non-linear corrector.

SUMMARY OF THE INVENTION

In accordance with the present invention there is provided a radio frequency (RF) transmitter system having an input circuit for receiving an RF signal to be amplified and transmitted. A series circuit is provided which includes first and second cascaded amplifier networks located downstream from the input circuit and wherein the first amplifier network is located upstream from the second amplifier network and wherein the first and second networks respectively include first and second non-linear amplifiers that exhibit non-linear response characteristics to the RF signal and that introduce non-linear distortions into the RF signal. The second network includes a filter that introduces linear distortions into the RF signal. A first correction circuit is located upstream from the series circuit for pre-correcting the RF signal in a manner to compensate for the linear and non-linear distortions introduced by the second amplifier network. A second pre-correction circuit is interposed between the first correction circuit and the first amplifier network for pre-correcting the RF signal to compensate for the non-linear distortions introduced by the first amplifier network. The second pre-correction circuit includes a third non-linear amplifier selected so as to exhibit a non-linear response characteristic to an applied RF signal similar to that of the first amplifier.

BRIEF DESCRIPTION OF THE DRAWINGS

The foregoing and other features of the invention will become apparent to one skilled in the art to which the present invention relates upon consideration of the following description of the invention with reference to the accompanying drawings, wherein.

DESCRIPTION OF PREFERRED EMBODIMENT

Figure 1:
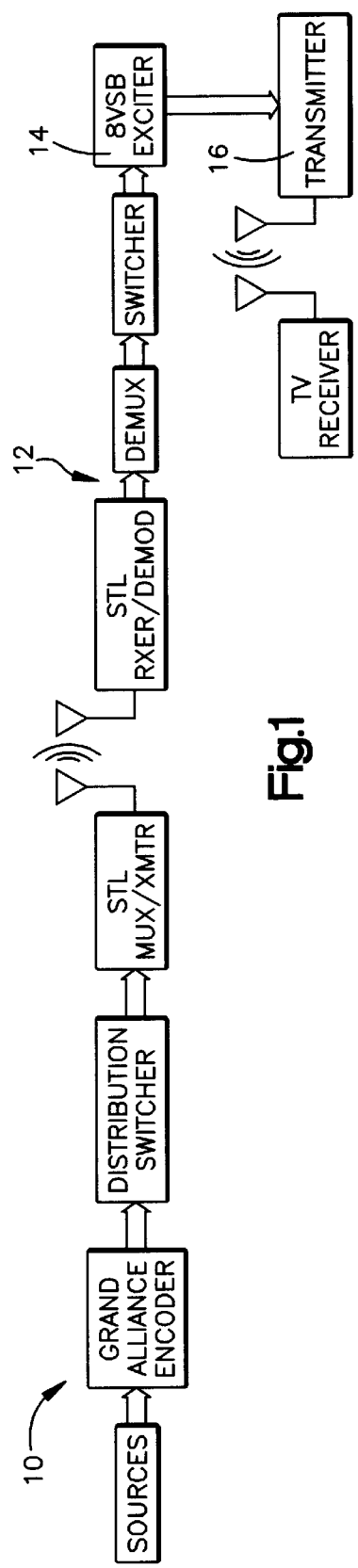
FIG. 1 is a block diagram of one application to which the present invention may be employed.
Figure 2:
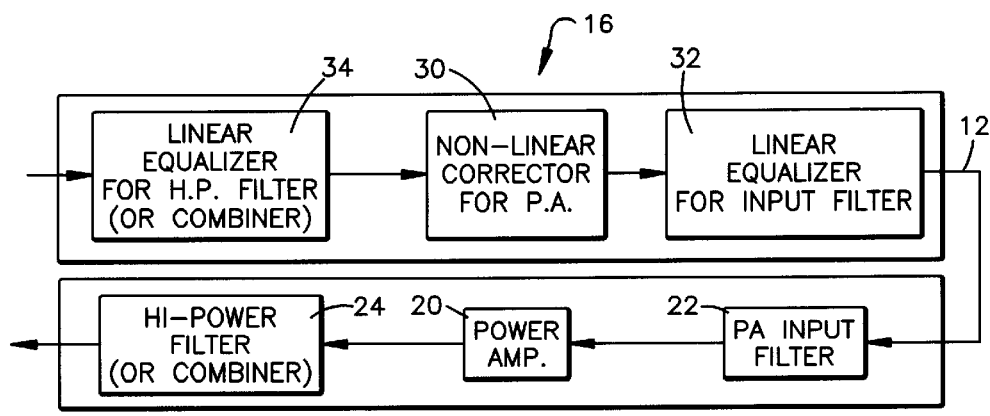
FIG. 2 is a block diagram illustration of a similar corrector circuit.
Figure 3:
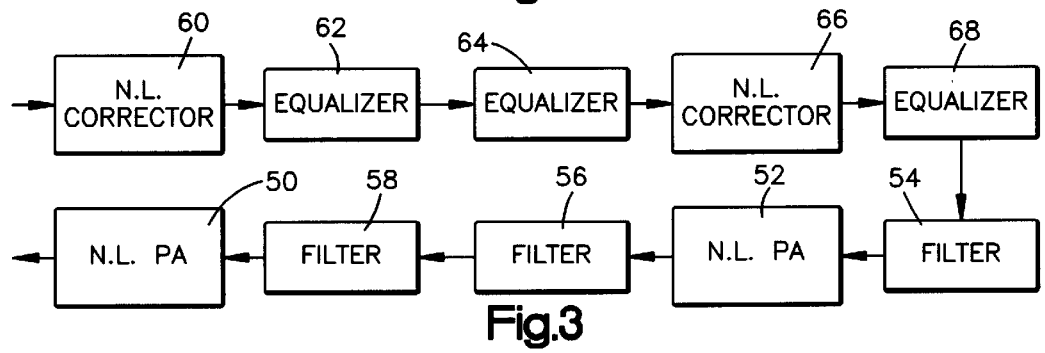
FIG. 3 is another block diagram illustration of a similar correction circuit; and, FIG. 4 is a schematic-block diagram illustration of one embodiment of the invention.

Before describing the preferred embodiment of the present invention, attention is first directed to FIGS. 1, 2 and 3. The present invention is intended for use in an RF broadcast system which may include high definition digital television sometimes referred to as HDTV or simply DTV. Such a system is illustrated in FIG. 1 and includes studio equipment 10 and transmitter equipment 12 with the link between the two taking the form of a microwave link (other suitable forms such as cable and the like may be employed). The components employed at the transmitter include an 8 VSB exciter 14 and a transmitter 16. The transmitter 16 (FIG. 2) includes a power amplifier 20, a pre-amplification filter 22 located upstream of the amplifier and a post amplification filter 24 located downstream of the amplifier. The pre-amplification filter is sometimes referred to as an input filter and the post-amplification filter is sometimes referred to as a high power output filter. It is to be appreciated that the transmitter 16 may include other components. The power amplifier 20 amplifies the information signal to a power level that is suitable for broadcast transmission of an RF signal. In one example, the amplified power level may be on the order of 50 kilowatts. The power amplifier 20 may be comprised of an array of amplifying devices. Also, the amplifier may include an inductive output tube (IOT).

A non-linear distortion (non-memory-full distortion) is imposed by the power amplifier 20 upon the information signal during amplification of the information signal. Specifically, the non-linear distortion is directed to changes in instantaneous amplitude and phase variations.

In addition, the filters 22 and 24 impose linear distortions (memory-full distortions) to the information signal. That is, the input filter 22 imposes a first linear distortion and the high powered filter 24 imposes a second linear distortion to the information signal.

The circuit in FIG. 2 provides pre-correction for the distortions introduced by filters 22 and 24 and amplifier 20. This circuit includes a non-linear pre-corrector 30 that serves to pre-correct the information signal for the non-linear distortions that are introduced by the power amplifier 20. A linear equalizer or pre-corrector 32 is located downstream from corrector 30 and serves to pre-correct the information signal for the linear distortions introduced by the input filter 22. Also, a linear equalizer or pre-corrector 34 located upstream from pre-corrector 30 serves to pre-correct the information signal for the linear distortions introduced by filter 24. The pre-correctors 30, 32 and 34 may, if desired, be adaptive pre-correctors.

Reference is now made to FIG. 3 which illustrates a more complex circuit including cascaded non-linear power amplifiers 50 and 52. An input filter 54 is located upstream of amplifier 52 and a filter 56 is located downstream from amplifier 52. Also, an input filter 58 is located upstream of power amplifier 50. The amplifiers 50 and 52 introduce non-linear distortions into the information signal being processed whereas filters 54, 56 and 58 introduce linear distortions to the information signal. These linear and non-linear distortions to the information signal are reduced with the pre-corrector circuitry illustrated in FIG. 3. In this example, a non-linear pre-corrector 60 provides pre-correction for the distortions introduced by the non-linear amplifier 50. An equalizer or pre-corrector 62 provides correction to compensate for the linear distortions introduced by filter 58. An equalizer or pre-corrector 64 provides pre-correction for the linear distortions introduced by filter 56. Also, a non-linear pre-corrector 66 provides pre-correction to compensate for the non-linear distortions introduced by the power amplifier 52. Also an equalizer or pre-corrector 68 provides pre-correction to compensate for the linear distortions introduced by filter 54.

Figure 4:
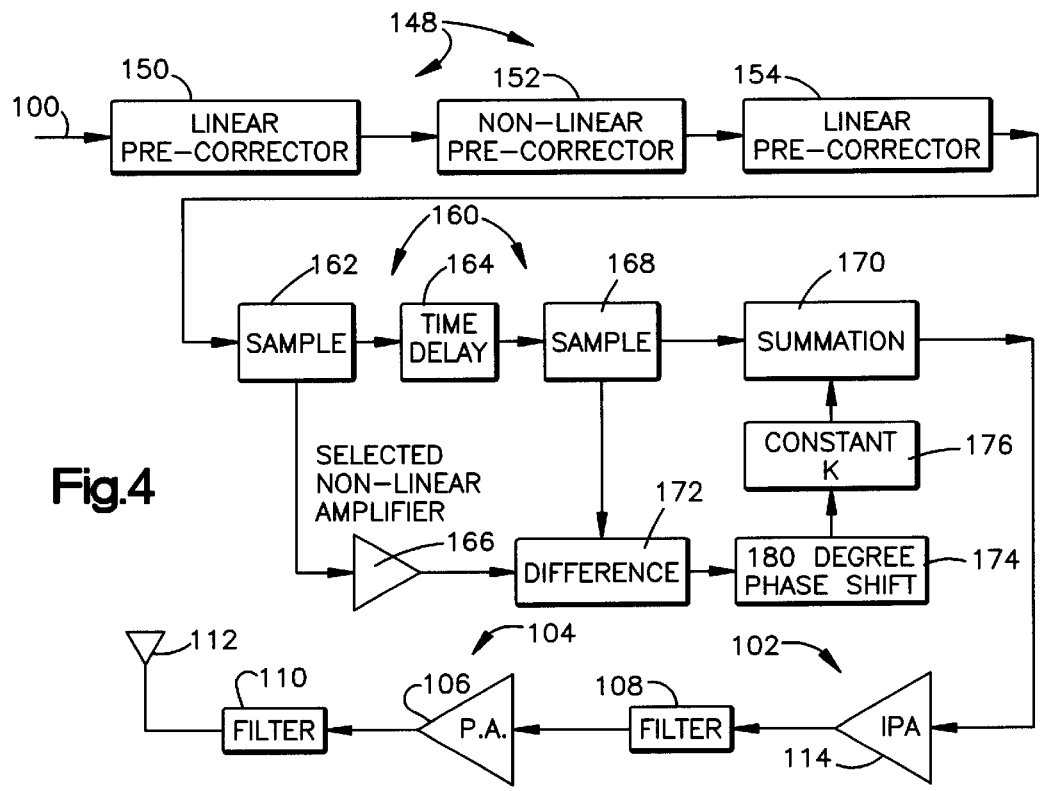

Reference is now made to FIG. 4 for a more detailed description of the preferred embodiment of the invention herein. In this embodiment, input circuit 100 receives an RF signal to be amplified and transmitted. A series circuit is provided including a first amplifier network 102 and a second amplifier network 104 which are cascaded. Network 102 is located upstream from network 104. More specifically, network 104 includes a power amplifier 106, an input filter 108 and an output filter 110 for supplying a signal to be transmitted to an antenna 112. The power amplifier 106 may take the form of an inductor output tube (IOT).

The second amplifier network includes an intermediate power amplifier (IPA) 114. The amplifier 114 may operate in the range of approximately 300–500 watts whereas the power amplifier 106 may operate in the range of approximately 25,000 watts. If pre-corrector circuitry is employed at this power level it would be quite costly. Consequently, the pre-corrector circuitry is separated and operates at a substantially lower level, such as in the vicinity of 1 milliwatt.

A first pre-corrector circuit 148 includes a linear pre-corrector 150 that provides linear correction to compensate for the linear distortions introduced by filter 110. A non-linear pre-corrector 152 is located downstream from corrector 150 and serves to provide compensation for the non-linear distortion introduced by the power amplifier 106. A linear pre-corrector 154 is located downstream from pre-corrector 152 and serves to compensate for the linear distortions introduced by filter 108.

A second pre-corrector circuit 160 is interposed between the first pre-corrector circuit 148 and the first amplifier network 102 to pre-correct the information signal to compensate for non-linear distortions introduce by network 102.

The pre-corrector circuit 160 includes a sampling device 162 that samples the information signal, as obtained from pre-corrector 154, and supplies a first portion of the signal to a time delay 164 and another portion to a selected non-linear amplifier 166. The sampling device 162 may be implemented by a zero degree splitter, a directional coupler or other sampling device. The outputs of the sampling device are scaled replications of the input signal received from the pre-corrector 154.

The amplifier 166 is selected such that it exhibits a non-linear response characteristic similar to or that mimics that of the non-linear amplifier 114. Amplifier 166 exhibits a non-linear response and generates an output which is larger than its input. The amplifier 166 may be a scaled version of the non-linear amplifier 114. It should be noted that if only memory-full distortions (linear distortions) are to be corrected, then the selected amplifier 166 need only correct linear distortions. If only non-linear distortions are to be corrected, then the amplifier need only create non-linear distortions. If both types of distortions are to be corrected, then the selected amplifier 166 should exhibit both linear and non-linear distortions. Amplifier 166 may run at a much lower power level than that of the amplifier 114. If desired, amplifier 166 could be identical to that of amplifier 114.

The time delay 164 receives a portion of the original input signal from the sampling device 10 and delays it by a time duration corresponding to the delay caused by amplifier 166 and supplies this time delayed portion to a sampling device 168. The time delay can be implemented by a coaxial line, a filter or other suitable time delaying means.

The sampling device 168 provides a first sample signal for application to a summation device 170 and a second sample for application to a difference circuit 172. The two signals obtained from the sampling device 168 may be at the same or at a reduced level from that of the input signal to the sampling device 168.

The sample of the input signal from device 160 and the output of the selected non-linear amplifier 166 are supplied to the difference circuit 172 which determines the difference between the two inputs and provides an output difference signal having a value representative of the difference of the two inputs.

The difference output signal is supplied to a 180 degree phase shift circuit 174 which inverts the applied signal. Thus, the output of the phase shift circuit 174 is the negative of the input to that circuit. The output of the phase shift circuit 174 is scaled by a scaling constant K at a scaling circuit 176. The value of K is either 1, less than 1 or greater than 1. It should be noted that circuits 174 and 176 may be reversed in their order.

The scaled negative difference signal obtained from circuit 176 is combined with the time delayed portion of the input signal in the summation device 170. The summation or corrected input signal is applied to the non-linear amplifier 114. The summation device 170 may be implemented in the form of a zero degree hybrid, direction coupler or other summing device. Also, the summation device 170 can be implemented in the form of a 180 degree hybrid wherein the phase shift circuit 174 becomes an inherent part of the 180 degree hybrid.

Although the invention has been described in conjunction with a preferred embodiment, it is to be appreciated that various modifications may be made without departing from the spirit and scope of the invention as defined by the appended claims.

I claim:

1. A radio frequency (RF) transmitter system comprising:
   an input circuit for receiving an RF signal to be amplified and transmitted;
   a series circuit including first and second cascaded amplifier networks located downstream from said input circuit and wherein said first amplifier network is located upstream from said second amplifier network and wherein said first amplifier network includes a first non-linear amplifier and said second amplifier network includes a second non-linear amplifier, said first and second non-linear amplifiers exhibit non-linear response characteristics to said RF signal and introduce non-linear distortions into said RF signal and said second amplifier network includes a filter located downstream from said second amplifier and said filter introduces linear distortions into said RF signal;
   a first pre-correction circuit located upstream from said series circuit for pre-correcting said RF signal in a manner to compensate for said linear and non-linear distortions introduced by said second amplifier network; and,
   a second pre-correction circuit interposed between said first pre-correction circuit and said first amplifier network for pre-correcting said RF signal to compensate for said non-linear distortions introduced by said first amplifier network, said second pre-correction circuit including a third non-linear amplifier selected so as to exhibit a non-linear response characteristic to an applied RF signal similar to that of said first amplifier.

2. A system as set forth in claim 1 including a sampler that obtains a first and second samples of said RF signal and applies said first sample to said third amplifier to generate an output signal therefrom.

3. A system as set forth in claim 2 including a difference circuit to detect any difference between said output signal and said second sample and provide a difference signal.

4. A system as set forth in claim 3 including an inverter to invert said difference signal to obtain an inverted difference signal.

5. A system as set forth in claim 4 including a combiner for combining the inverted difference signal with said second sample to obtain a corrected input signal for application to said first amplifier.

6. A system as set forth in claim 5 wherein said first pre-correction circuit includes a linear pre-corrector and a non-linear pre-corrector.

7. A system as set forth in claim 5 including a second filter in said second amplifier network said second filter is upstream from said second amplifier.

8. A system as set forth in claim 7 wherein said first pre-correction circuit includes a non-linear pre-corrector and a linear pre-corrector located downstream from said non-linear pre-corrector.

9. A system as set forth in claim 1 wherein said first pre-correction circuit includes a non-linear pre-corrector and a linear pre-corrector located upstream from said non-linear pre-corrector.

10. A radio frequency (RF) transmitter system comprising:
    an input circuit for receiving an RF signal to be amplified and transmitted;
    a series circuit including first and second cascaded amplifier networks located downstream from said input circuit and wherein said first amplifier network is located upstream from said second amplifier network and wherein said first amplifier network includes a first non-linear amplifier and said second amplifier network includes a second non-linear amplifier, said first and second non-linear amplifiers exhibit non-linear response characteristics to said RF signal and introduce non-linear distortions into said RF signal and said second amplifier network includes a filter that introduces linear distortions into said RF signal;
    a first pre-correction circuit located upstream from said series circuit for pre-correcting said RF signal in a manner to compensate for said linear and non-linear distortions introduced by said second amplifier network;
    a second pre-correction circuit interposed between said first pre-correction circuit and said first amplifier network for pre-correcting said RF signal to compensate for said non-linear distortions introduced by said first amplifier network, said second pre-correction circuit including a third non-linear amplifier selected so as to exhibit a non-linear response characteristic to an applied RF signal similar to that of said first amplifier;
    a sampler that obtains a first and second samples of said RF signal and applies said first sample to said third amplifier to generate an output signal therefrom;
    a difference circuit to detect any difference between said output signal and said second sample and provide a difference signal;
    an inverter to invert said difference signal to obtain an inverted difference signal;
    a combiner for combining the inverted difference signal with said second sample to obtain a corrected input signal for application to said first amplifier; and
    said filter is a first filter located upstream from said second amplifier and said second amplifier network further includes a second filter located downstream from said second amplifier.

11. A system as set forth in claim 10 wherein said first pre-correction circuit includes a non-linear pre-corrector, a first linear pre-corrector located upstream from said non-linear pre-corrector and a second linear pre-corrector located downstream from said non-linear pre-corrector.

* * * * *